US006949792B2

(12) United States Patent
Hurley et al.

(10) Patent No.: US 6,949,792 B2
(45) Date of Patent: Sep. 27, 2005

(54) STACKED GATE REGION OF A MEMORY CELL IN A MEMORY DEVICE

(75) Inventors: Kelly T. Hurley, Boise, ID (US); Graham Wolstenholme, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/852,312

(22) Filed: May 24, 2004

(65) Prior Publication Data

US 2004/0245565 A1 Dec. 9, 2004

Related U.S. Application Data

(60) Continuation of application No. 10/273,053, filed on Oct. 17, 2002, now Pat. No. 6,759,708, which is a division of application No. 09/808,484, filed on Mar. 14, 2001, now abandoned.

(51) Int. Cl.[7] .............................................. H01L 29/788
(52) U.S. Cl. ....................................... 257/315; 257/314
(58) Field of Search ................................. 257/314, 315, 257/316, 317, 318, 319, 320, 321, 322, 323

(56) References Cited

U.S. PATENT DOCUMENTS

| | | | |
|---|---|---|---|
| 5,111,270 A | 5/1992 | Tzeng | |
| 5,210,047 A | 5/1993 | Woo et al. | |
| 5,298,784 A | 3/1994 | Gambino et al. | |
| 5,494,857 A | * 2/1996 | Cooperman et al. | |
| 5,521,109 A | 5/1996 | Hsue et al. | |
| 5,618,742 A | 4/1997 | Shone et al. | |
| 5,661,054 A | 8/1997 | Kauffman et al. | |
| 5,680,345 A | 10/1997 | Hsu et al. | |
| 5,747,848 A | * 5/1998 | Yoo et al. | |
| 5,770,501 A | 6/1998 | Hong | |
| 5,883,409 A | 3/1999 | Guterman et al. | |
| 5,965,913 A | 10/1999 | Yuan et al. | |
| 6,008,517 A | 12/1999 | Wu | |
| 6,046,086 A | 4/2000 | Lin et al. | |
| 6,051,999 A | * 4/2000 | To et al. | |
| 6,058,045 A | 5/2000 | Pourkeramati | |
| 6,074,916 A | 6/2000 | Cappelletti | |
| 6,153,472 A | 11/2000 | Ding et al. | |
| 6,171,909 B1 | 1/2001 | Ding et al. | |
| 6,180,490 B1 | 1/2001 | Vassiliev et al. | |
| 6,200,856 B1 | 3/2001 | Chen | |
| 6,235,589 B1 | 5/2001 | Meguro | |
| 6,281,078 B1 | * 8/2001 | Chang et al. | |
| 6,326,263 B1 | 12/2001 | Hsieh | |
| 6,359,305 B1 | * 3/2002 | Chiu | |
| 6,362,035 B1 | 3/2002 | Shih et al. | |
| 6,420,249 B1 | 7/2002 | Doan et al. | |
| 6,462,373 B2 | 10/2002 | Shimizu et al. | |
| 6,537,879 B2 | 3/2003 | Bez et al. | |
| 6,617,638 B2 | 9/2003 | Chiang et al. | |
| 2002/0102793 A1 | 8/2002 | Wu | |

OTHER PUBLICATIONS

Wolf "Silicon Processing for the VLSI Era, vol. 2—Process Integration," 1990, Lattice Press, p. 12–13.*

* cited by examiner

Primary Examiner—Nathan J. Flynn
Assistant Examiner—Kevin Quinto
(74) Attorney, Agent, or Firm—Dinsmore & Shohl LLP

(57) ABSTRACT

Semiconductor devices are disclosed utilizing at least one polysilicon structure in a stacked gate region according to the present invention. The stacked gate region includes a substrate, at least one trench, an oxide layer, at least one floating gate layer and the at least one polysilicon structure. The at least one polysilicon structure is formed adjacent to vertical edges of the at least one floating gate layer and above the oxide layer. The polysilicon structure, which includes polysilicon wings and ears, is used to increase the capacitive coupling of memory cells in memory devices, thereby allowing for further reduction or scaling in the size of memory cells and devices.

33 Claims, 13 Drawing Sheets

STACKED GATE REGION OF A MEMORY CELL IN A MEMORY DEVICE

CROSS REFERENCE TO RELATED APPLICATIONS

This application is a continuation of U.S. patent application Ser. No. 10/273,053 filed Oct. 17, 2002, now U.S. Pat. No. 6,759,708 which is a division of U.S. patent application Ser. No. 09/808,484 filed Mar. 14, 2001 (abandoned).

BACKGROUND OF THE INVENTION

The present invention relates to the field of semiconductor manufacture and, more particularly, to polysilicon structures in a stacked gate region of a semiconductor device, such as for example, a flash memory device. As computers become increasingly complex, the need for improved memory storage, and in particular, the need for an increased number of memory cells per unit area, increases. At the same time, there is a continuing drive to minimize the size of computers and memory devices. Accordingly, it is a goal of memory device fabrication to increase the number of memory cells per unit area or wafer area.

A conventional non-volatile semiconductor memory device in which contents are electrically programmable and simultaneously erased by one operation is a flash memory-device. Flash memory allows for blocks of memory cells to be erased in one operation. Flash memory devices have the characteristics of low power and fast operation making them ideal for portable devices. Flash memory is commonly used in portable devices such as laptop or notebook computers, digital audio players and personal digital assistant (PDA) devices.

In flash memory, a charged floating gate is one logic state, typically represented by the binary digit 1, while a non-charged floating gate is the opposite logic state typically represented by the binary digit 0. Charges are injected or written to a floating gate by any number of methods, including avalanche injection, channel injection, Fowler-Nordheim tunneling, and channel hot electron injection, for example.

An important parameter for a flash memory cell is the capacitive coupling of the memory cell. It is difficult to reduce the size or scale down the memory cell while maintaining a desired or required capacitive coupling. This parameter can be a significant factor in the drive to reduce memory cell size. Accordingly, there is a need for a memory cell production scheme directed to reducing the size of a memory cell while maintaining or improving the capacitive coupling of the memory cell.

SUMMARY OF THE INVENTION

This need is met by the present invention, wherein a stacked gate region of a memory cell is disclosed. The flash memory device includes a substrate, at least one trench, an oxide layer, at least one floating gate and at least one polysilicon wing. The substrate has at least one semiconductor layer. The at least one trench is formed in the substrate and filled with an oxide. The oxide layer is formed over the substrate and the trench. The at least one floating gate is formed over the oxide layer. The at least one polysilicon wing is formed adjacent to vertical edges of the at least one floating gate and over the oxide layer. Other methods and devices are disclosed.

The present invention includes polysilicon wings or ears which can increase the capacitive coupling of memory cells in memory devices in which they are used. Generally, the polysilicon wings or ears are placed proximate to the floating gate of a memory cell. Thus, the present invention may allow for further reducing or scaling the size of memory cells and devices.

According to one embodiment of the invention, a stacked gate region of a memory cell is disclosed having a substrate, at least one trench, a field oxide region, a tunnel oxide layer, at least one floating gate layer and at least one polysilicon wing. The substrate has at least one semiconductor layer. The at least one trench is formed in the substrate. The field oxide region is formed in the trench. The tunnel oxide layer is formed over the substrate. The at least one floating gate is formed over the tunnel oxide layer. The at least one polysilicon wing is formed adjacent to the at least one floating gate layer and over a portion of the field oxide region.

According to another embodiment of the invention, a stacked gate region of a memory cell is disclosed. The stacked gate region includes a substrate, at least one trench, field oxide, a tunnel oxide layer, at least one floating gate and at least one polysilicon ear. The substrate has at least one semiconductor layer. The at least one trench is formed in the substrate. The field oxide is deposited in the at least one trench and extends above an upper surface of the substrate. The tunnel oxide layer is formed over at least a portion of the substrate. The at least one floating gate layer is formed over the tunnel oxide layer. The at least one polysilicon ear is formed on the at least one floating gate layer and adjacent to the field oxide.

According to yet another embodiment of the invention, a stacked gate region of a memory cell is disclosed. The stacked gate region includes a substrate, at least one trench, a tunnel oxide layer, at least one floating gate layer, field oxide and at least on polysilicon ear. The substrate has at least one semiconductor layer. The at least one trench is formed in the substrate. The tunnel oxide layer is formed over at least a portion of the substrate. The at least one floating gate layer is formed over the oxide layer. The field oxide is deposited in the at least one trench. The at least one polysilicon ear is formed on the at least one floating gate layer.

According to yet another embodiment of the invention, a stacked gate region of a memory cell is disclosed. The stacked gate region includes a substrate, a plurality of trenches, a tunnel oxide layer, at least one floating gate layer, field oxide regions and a pair of polysilicon wings. The substrate has at least one semiconductor layer. The plurality of trenches are formed in the substrate. The respective field oxide regions are formed in the trenches. The tunnel oxide layer is formed over the substrate. The floating gate layer is formed over the tunnel oxide layer. The pair of polysilicon wings are located adjacent to opposite ends of the floating gate layer, co-planer with the floating gate layer and over a portion of corresponding ones of the field oxide regions.

According to yet another embodiment of the invention, a stacked gate region of a memory cell is disclosed. The stacked gate region includes a substrate, a plurality of trenches, a tunnel oxide layer, at least one floating gate layer, field oxide regions and a pair of polysilicon ears. The substrate has at least one semiconductor layer. The plurality of trenches are formed in the substrate. The respective field oxide regions are formed in the trenches. The tunnel oxide layer is formed over the substrate. The floating gate layer is formed over the tunnel oxide layer. The pair of polysilicon ears are formed adjacent to corresponding ones of the field oxide regions on the floating gate layer and projecting perpendicular to an upper surface of the floating gate layer.

According to yet another embodiment of the invention, a stacked gate region of a memory cell is disclosed. The stacked gate region includes a substrate, a plurality of trenches, a tunnel oxide layer, at least one floating gate layer, field oxide regions and a pair of polysilicon ears. The substrate has at least one semiconductor layer. The plurality of trenches are formed in the substrate. The respective field oxide regions are formed in the trenches. The tunnel oxide layer is formed over the substrate. The floating gate layer is formed over the tunnel oxide layer. The pair of polysilicon ears are formed adjacent to the floating gate layer.

According to yet another embodiment of the invention, a memory cell is disclosed. The memory cell includes a substrate, a source, a drain, at least one trench, a field oxide region, a tunnel oxide layer, at least one floating gate layer, at least one polysilicon wing, a dielectric layer and a control gate. The substrate has at least one semiconductor layer. The source is formed in the substrate. The drain is formed in the substrate. The at least one trench is formed in the substrate. The field oxide region is formed in the trench. The tunnel oxide layer is formed over the substrate. The at least one floating gate layer is formed over the tunnel oxide layer. The at least one polysilicon wing is formed adjacent to the at least one floating gate layer and over a portion of the field oxide region. The dielectric layer is formed over the substrate and the floating gate layer. The control gate layer is formed over the dielectric layer.

According to yet another embodiment of the invention, a memory cell is disclosed. The memory cell includes a substrate, a source, a drain, at least one trench, a field oxide region, a tunnel oxide layer, at least one floating gate layer, at least one polysilicon wing, a dielectric layer and a control gate. The substrate has at least one semiconductor layer. The source is formed in the substrate. The drain is formed in the substrate. The at least one trench is formed in the substrate. The field oxide region is formed in the trench. The tunnel oxide layer is formed over the substrate. The at least one floating gate layer is formed over the tunnel oxide layer. The at least one polysilicon ear is formed on the at least one floating gate layer and adjacent to the field oxide. The dielectric layer is formed over the substrate and the floating gate layer. The control gate layer is formed over the dielectric layer.

According to yet another embodiment of the invention, a memory cell is disclosed. The memory cell includes a substrate, a source, a drain, at least one trench, a field oxide region, a tunnel oxide layer, at least one floating gate layer, at least one polysilicon wing, a dielectric layer and a control gate. The substrate has at least one semiconductor layer. The source is formed in the substrate. The drain is formed in the substrate. The at least one trench is formed in the substrate. The field oxide region is formed in the trench. The tunnel oxide layer is formed over the substrate. The at least one floating gate layer is formed over the tunnel oxide layer. The at least one polysilicon ear is formed on the at least one floating gate layer. The dielectric layer is formed over the substrate and the floating gate layer. The control gate layer is formed over the dielectric layer.

According to yet another embodiment of the invention, a method of fabricating a stacked gate region is disclosed. A substrate having at least one semiconductor layer is provided. A tunnel oxide layer is formed over the substrate. A first polysilicon layer is formed over the tunnel oxide layer. A nitride layer is formed over the first polysilicon layer. Selected areas of the first polysilicon layer are masked. Unmasked areas of the first polysilicon layer are etched leaving at least one floating gate layer. Trench areas are patterned in the substrate. Field oxide is deposited in the trench. A surface of the stacked gate structure is planarized. An oxide etch back is performed to remove selected amounts of the field oxide. The nitride layer is removed. A second polysilicon layer is deposited over the substrate. Selected portions of the second polysilicon layer are removed so as to leave polysilicon wings formed adjacent to the at least one floating gate layer and over a portion of the field oxide.

According to another embodiment of the invention, a method of fabricating a stacked gate region is disclosed. A substrate having at least one semiconductor layer is provided. A tunnel oxide layer is formed over the substrate. A first polysilicon layer is formed over the tunnel oxide layer. A nitride layer is formed over the first polysilicon layer. Areas of the nitride layer and first polysilicon layer are selectively removed leaving at least one floating gate layer. Trench areas are patterned in the substrate. Field oxide is deposited in the trench areas. A surface of the stacked gate region is planarized. The nitride layer is removed. A second polysilicon layer is deposited over the substrate. Portions of the second polysilicon layer are selectively removed leaving single sided ears, each having one vertical side adjacent to sides of the field oxide and one lower side on one of the at least one floating gate layer.

According to yet another embodiment of the invention, a method of fabricating a stacked gate region is disclosed. A substrate having at least one semiconductor layer is provided. A tunnel oxide layer is formed over the substrate. A first polysilicon layer is formed over the substrate. A nitride layer is formed over the first polysilicon layer. Selected portions of the tunnel oxide layer, the first polysilicon layer, the nitride layer and the substrate are removed to form the at least one trench to a desired depth. Field oxide is deposited into the at least one trench. The field oxide and the nitride layer are planarized. The nitride layer is removed. A second polysilicon layer is deposited over the substrate and portions of the second polysilicon layer are selectively removed leaving single sided ears, each having one vertical side adjacent to sides of the field oxide and one lower side on one of the at least one floating gate layer. A portion of the field oxide is removed such that an upper surface of the field oxide is substantially co-planer with an upper surface of the at least one floating gate layer leaving double sided ears.

According to another embodiment of the invention, a method of fabricating a memory cell is disclosed. A substrate having at least one semiconductor layer is provided. A floating gate layer is formed over the substrate. A trench is formed in the substrate. A polysilicon wing is formed adjacent to a vertical edge of the floating gate.

According to still yet another embodiment of the present invention, a method of fabricating a memory cell is disclosed. A substrate having at least one semiconductor layer is provided. A floating gate layer is formed over a substrate without using photolithography. A trench is formed in the substrate. Field oxide is deposited into the trench beyond an upper surface of the floating gate layer. A polysilicon ear is formed over the floating gate layer and adjacent to an exposed vertical edge of the field oxide.

According to another embodiment of the invention, a method of fabricating a memory cell is disclosed. A substrate having at least one semiconductor layer is provided. A floating gate layer is formed over the substrate without using photolithography. A trench is formed in the substrate. Field oxide is deposited into the trench beyond an upper surface of the floating gate layer. A polysilicon ear is formed over the floating gate layer and adjacent to an exposed vertical edge of the field oxide. Field oxide is removed such that an upper surface of the field oxide is substantially planar to the upper surface of the floating gate layer.

According to another embodiment of the invention, a method of fabricating a memory cell is disclosed. A substrate having at least one semiconductor layer is provided. A source and drain are formed in the substrate. A tunnel oxide layer is formed over the substrate. A first polysilicon layer is formed over the tunnel oxide layer. A nitride layer is formed over the first polysilicon layer. Selected areas of the first polysilicon layer are masked. Unmasked areas of the first polysilicon layer are etched leaving at least one floating gate layer. Trench areas are patterned in the substrate. Field oxide is deposited in the trench areas. A surface of the stacked gate structure is planarized. An oxide etch back is performed to remove selected amounts of the field oxide. The nitride layer is removed. A second polysilicon layer is deposited over the substrate and selected portions of the second polysilicon layer are removed so as to leave polysilicon wings formed adjacent to the at least one floating gate layer and over a portion of the field oxide. A dielectric layer is formed over the floating gate layer. A control gate layer is formed over the dielectric layer.

According to yet another embodiment of the invention, a method of fabricating a memory cell is disclosed. A substrate having at least one semiconductor layer is provided. A source and drain are formed in the substrate. A tunnel oxide layer is formed over the substrate. A first polysilicon layer is formed over the tunnel oxide layer. A nitride layer is formed over the first polysilicon layer. Areas of the nitride layer and first polysilicon layer are selectively removed leaving at least one floating gate layer. Trench areas are patterned in the substrate. Field oxide is deposited in the trench areas. Planarization is performed. The nitride layer is removed. A second polysilicon layer is deposited over the substrate. Portions of the second polysilicon layer are removed leaving single sided ears, each having one vertical side adjacent to sides of the field oxide and one lower side on one of the at least one floating gate layer. A dielectric layer is formed over the floating gate layer, the polysilicon ears and the substrate. A control gate layer is formed over the dielectric layer.

According to another embodiment of the invention, a method of fabricating a memory cell is disclosed. A substrate having at least one semiconductor layer is provided. A source and a drain are formed in the substrate. A tunnel oxide layer is formed over the substrate. A first polysilicon layer is formed over the substrate. A nitride layer is formed over the first polysilicon layer. Selected portions of the tunnel oxide layer, the first polysilicon layer, the nitride layer and the substrate are removed to form at least one shallow trench to a desired depth. Field oxide is deposited into the at least one shallow trench. The field oxide and the nitride layer are planarized to create a planar surface of the stacked gate structure. The nitride layer is removed. A second polysilicon layer is formed over the substrate and portions of the second polysilicon layer are removed leaving single sided ears, each having one vertical side adjacent to sides of the field oxide and one lower side on one of the at least one floating gate layer. A portion of the field oxide is removed such that an upper surface of the field oxide is substantially co-planer with an upper surface of the at least one floating gate layer leaving double sided ears. A dielectric layer is formed over the floating gate layer, the polysilicon wings and the substrate. A control gate layer is formed over the dielectric layer.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

DETAILED DESCRIPTION OF THE INVENTION

Figure 1A:
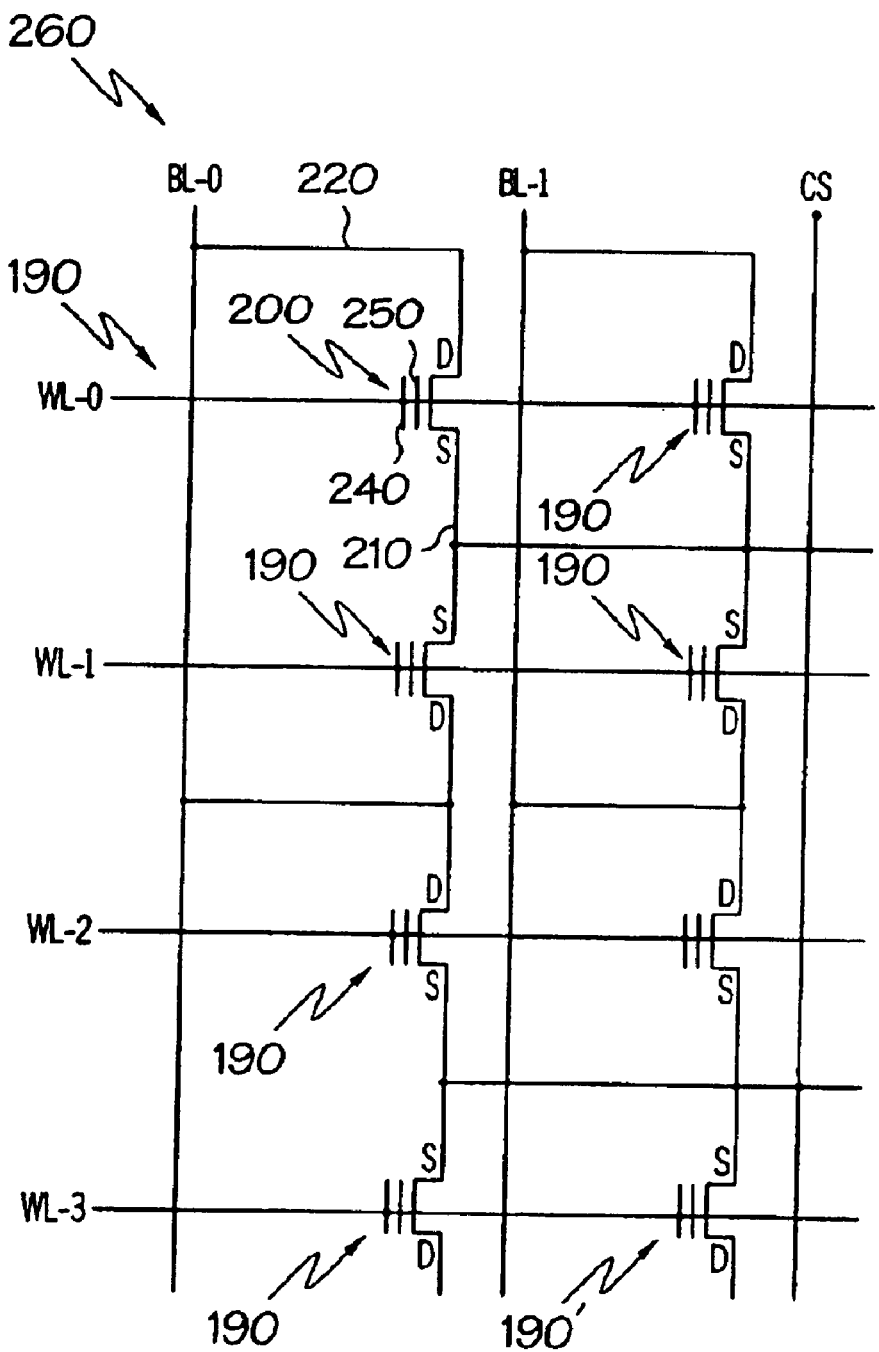
FIG. 1A illustrates a memory array according to one embodiment of the invention.

FIG. 1A illustrates a memory array 260 according to one embodiment of the invention. The memory array 260 includes a plurality of memory cells 190. Each memory cell 190 includes a source 210, drain 220 and a stacked gate region or gate structure 200. The gate structure 200 includes a floating gate 250 and a control gate 240. The floating gate 250 includes polysilicon wings or ears, described in further detail herein, which increase the capacitive coupling of the memory cell 190. The control gates 240 of the respective cells 190 in a row are formed integral to a common word line (WL) associated with the row. In the completed memory array, the source 210 of each memory cell 190 in a column is formed in a common region with the source 210 of one of the adjacent memory cells. Similarly, the drain 220 of each memory cell is formed in a common region with the drain 220 of another adjacent memory cell. Additionally, the sources 210 of each memory cell 190 in a row, and hence pair of rows, are formed as a common region, facilitating formation of a common source line CS. The drain of each cell in a row of cells is connected by a conductive bit line (BL). A memory array of this nature, but without polysilicon wings or ears, is illustrated in further detail in U.S. Pat. No. 5,680,345, the disclosure of which is incorporated herein by reference.

To effect a charge on floating gate 250, the voltage on control gate 240 is capacitively coupled to floating gate 250, which permits control gate 240 to control the voltage on floating gate 250. Inadequate capacitive coupling between control gate 240 and floating gate 250 may inhibit proper operation of memory cell 190. The degree or amount of capacitive coupling is increased by increasing the overlapping surface area of control gates 240 to floating gates 250. Control gate 240 and floating gate 250 generally comprise parallel planes of conductive material separated by a dielectric layer. If the floating gate 250 is too small, the effectiveness of the coupling degrades and adversely affects the threshold voltage. Consequently, each floating gate 250 must provide sufficient area to effectively couple control gate 240 to floating gate 250. By including polysilicon wings or ears of the present invention, as described in further detail herein, with the floating gate 250, the lateral dimensions of the floating gate 250 can be reduced, thereby reducing the size of the memory cell, while maintaining an appropriate capacitive coupling.

Figure 1B:
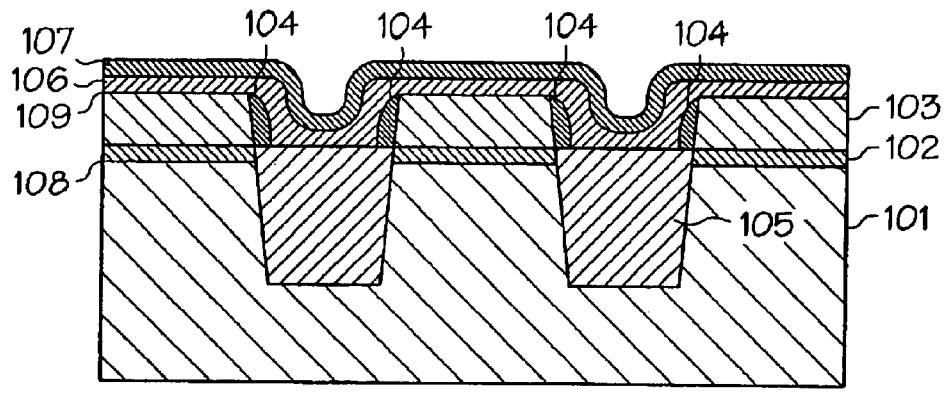
FIG. 1B illustrates a cross section of a selected portion of a memory cell according to one embodiment of the invention.

FIG. 1B illustrates a stacked region of a memory cell according to one embodiment of the invention. The illustrated portion of the memory cell includes a substrate 101, a tunnel oxide layer 102, a floating gate (FG) polysilicon (poly) layer 103, floating gate poly wings 104, a field oxide region 105, a dielectric layer 106 and a control gate layer 107. The substrate 101 is generally silicon, but other types of semiconductor materials may be used and has an upper surface 108. The field oxide region 105 electrically isolates individual memory cells. The FG poly layer 103 includes an upper surface 109. The FG poly layer 103 and the FG poly wings 104 typically comprise conductive polysilicon but need not be made of the same material. The configuration of the FG poly layer 103 and the FG poly wings 104 enables formation of a memory cell characterized by higher capacitive coupling between the FG structure and the control gate layer 107. The FG poly wings 104 overlap the field oxide region 105. For the purpose of defining and describing the present invention, "wings" comprise regions of material located adjacent to and generally coplanar with an associated material. Wings are described herein as merely "generally" coplanar because it is contemplated that portions of a wing may extend beyond or outside the bounds of the plane of the associated material. In the embodiment of FIG. 1B, for example, the wings 104 are located adjacent to and are generally coplanar with the FG poly layer 103. The stacked gate region of a memory cell is able to be fabricated without using a floating gate photolithography step.

Figure 2:
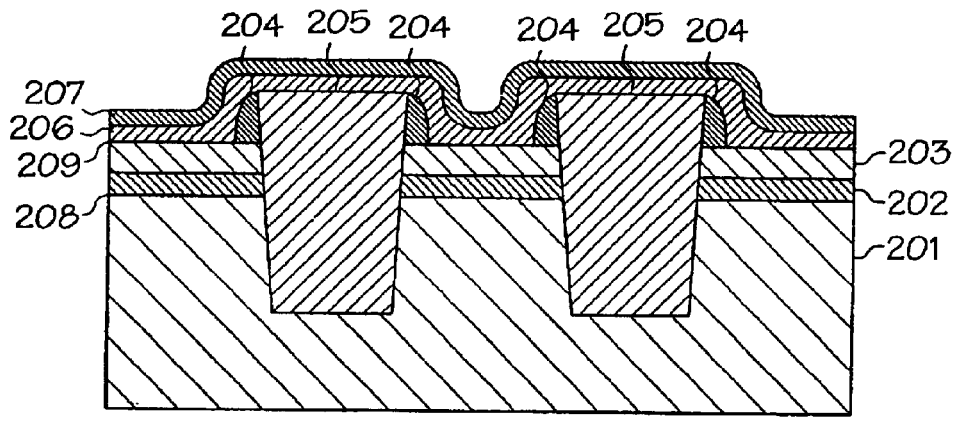
FIG. 2 illustrates a cross section of selected portion of a memory cell according to another embodiment of the invention.

FIG. 2 illustrates a stacked region of a memory cell according to another embodiment of the invention. The illustrated portion of the memory cell includes a substrate 201, a tunnel oxide layer 202, a floating gate (FG) polysilicon (poly) layer 203, floating gate poly ears 204, a field oxide region 205, a dielectric layer 206 and a control gate layer 207. The substrate 201 is generally silicon, but other types of semiconductor materials may be used. The substrate 201 has an upper surface 208. The FG poly layer 203 includes an upper surface 209. The FG poly layer 203 and the FG poly ears 204 may be made of the same material or different material. The configuration of the FG poly layer 203 and the FG poly ears 204 results in a higher capacitive coupling between the FG poly structure and the control gate layer 207. A single side of the FG poly ears 204 contacts the field oxide region 205. For the purposes of describing and defining the present invention, "ears" comprises regions of material positioned adjacent to a portion of an associated material and projecting from or extending substantially beyond the bounds of the plane of the associated material. In the embodiment of FIG. 2, for example, the ears 204 are adjacent to a portion of the FG poly layer 203 and project from the FG poly layer 203 in a substantially perpendicular fashion. The poly ears 204 of FIG. 2 may also be identified as "single-sided" ears because they are adjacent to field oxide on a single side. The memory cell of FIG. 2 may also be fabricated without using a floating gate photolithography step.

Figure 3:
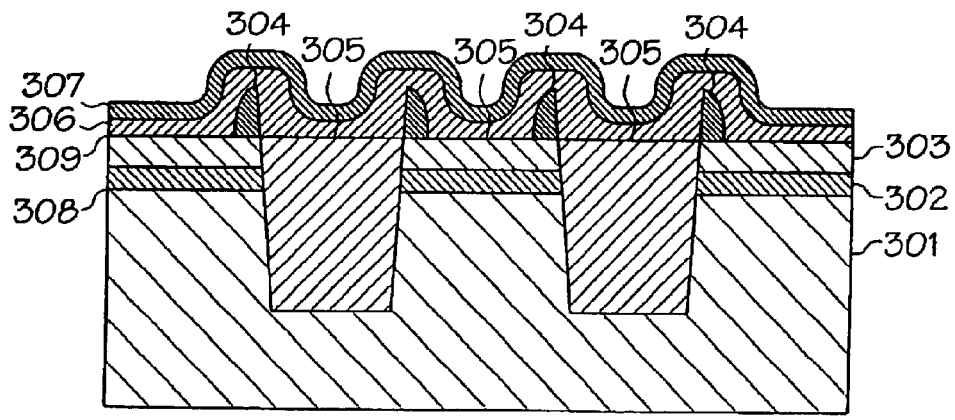
FIG. 3 illustrates a cross section of selected portion of a memory cell according to another embodiment of the invention.

FIG. 3 illustrates a stacked region of a memory cell according to another embodiment of the invention. The stacked region of a memory cell includes a substrate 301, a tunnel oxide layer 302, a floating gate (FG) polysilicon (poly) layer 303, floating gate poly ears 304, a field oxide region 305, a dielectric layer 306 and a control gate layer 307. The substrate 301 is generally silicon, but other types of semiconductor materials may be used. The substrate 301 has an upper surface 308. The FG poly layer 303 includes an upper surface 309. The FG poly layer 303 and the FG poly ears 304 may be made of the same material or different material. The configuration of the FG poly layer 303 and the FG poly ears 304 results in a higher capacitive coupling between the FG poly layer 303 and the control gate layer 307 for memory cells of the flash memory device. The poly ears of FIG. 3 may also be identified as double sided ears because both vertical sides avoid contact with the field oxide region 305. Neither side of the FG poly ears 304 overlap or contact the field oxide region 305, further increasing the capacitive coupling of the memory cells. The memory cell of FIG. 3 may also be fabricated without using a floating gate photolithography step.

Figure 4:
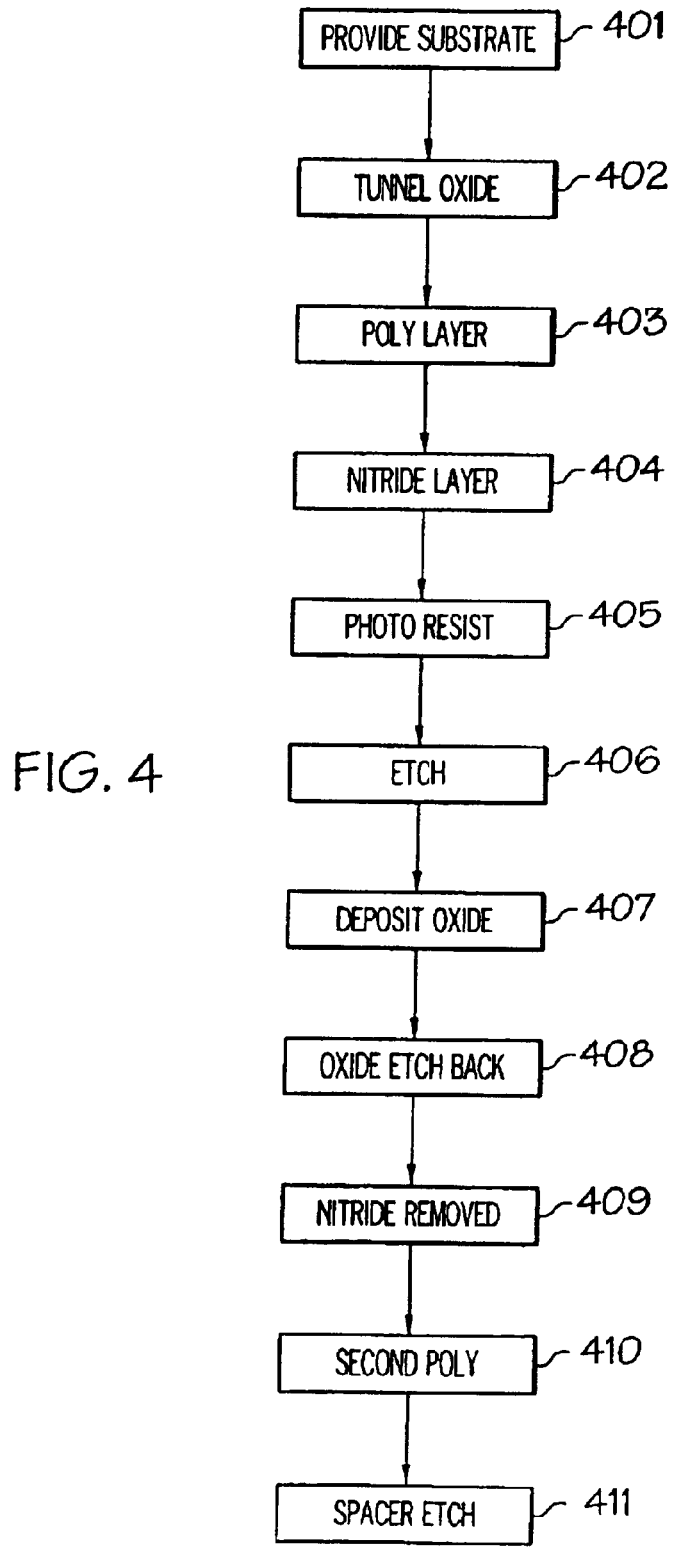
FIG. 4 illustrates a method of fabricating a memory cell according to one embodiment of the invention.

FIG. 4 illustrates a method of fabricating the stacked gate region illustrated in FIG. 1B. FIGS. 5A, 5B, 5C, 5D, 5E, 5F and 5G illustrate stages of the method of FIG. 4.

Figure 5A:
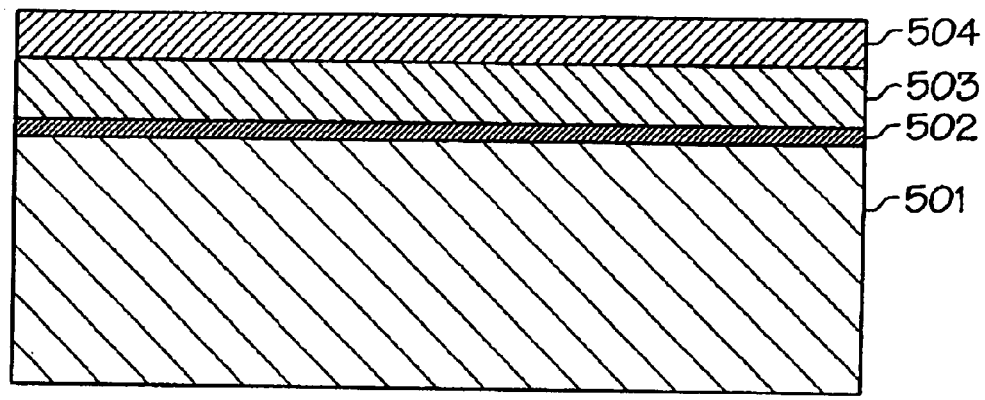
FIG. 5A illustrates a stage of fabrication of the method of FIG. 4.

A substrate 501 is provided at 401. The substrate 501 is, generally, a silicon substrate. A tunnel oxide layer 502 is formed over the substrate 501 at 402. A self aligned floating gate (SA-FG) poly layer 503 is formed over the tunnel oxide layer 502 at 403. A nitride layer 504 is formed over the SA-FG poly layer 503 at block 404. FIG. 5A illustrates the stacked gate region at this stage of the method.

Figure 5B:
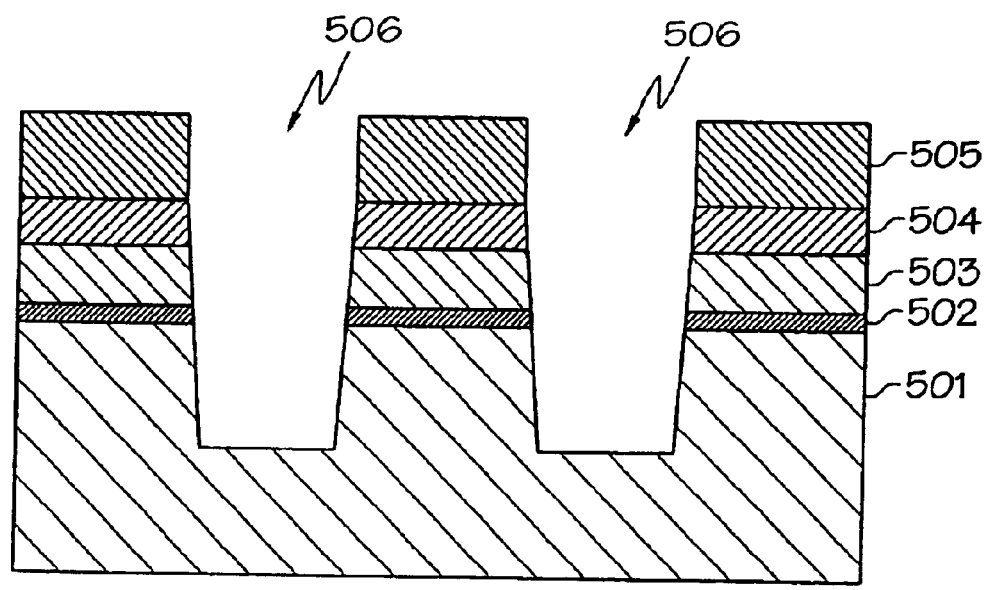
FIG. 5B illustrates a stage of fabrication of the method of FIG. 4.

A layer of photo resist 505 is deposited over the nitride layer 504 in selected areas by utilizing a mask at block 405. The areas covered by the photo resist indicate areas not to be etched and permit forming gates of the flash memory device. The flash memory device is etched at block 406. Layers and substrate are removed by the etch to form a shallow trench as shown by 506 in FIG. 5B. The etch performed at block 406, may also be referred to as a shallow trench isolation (STI) etch. FIG. 5B illustrates the stacked gate region at this stage of the method.

Figure 5C:
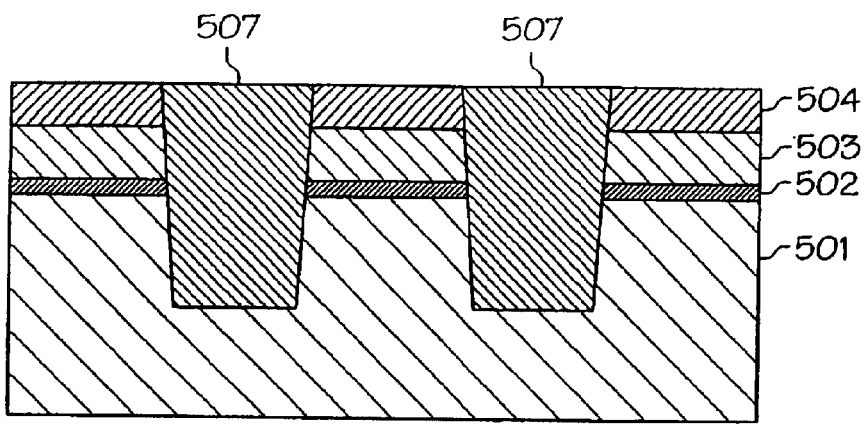
FIG. 5C illustrates a stage of fabrication of the method of FIG. 4.

The photo resist 505 is removed, field oxide 507 is deposited into the trenches and mechanical planarization is performed at block 407. For example, chemical mechanical planarization (CMP) could be used as one type of mechanical planarization. FIG. 5C illustrates the stacked gate region at this stage of the method.

Figure 5D:
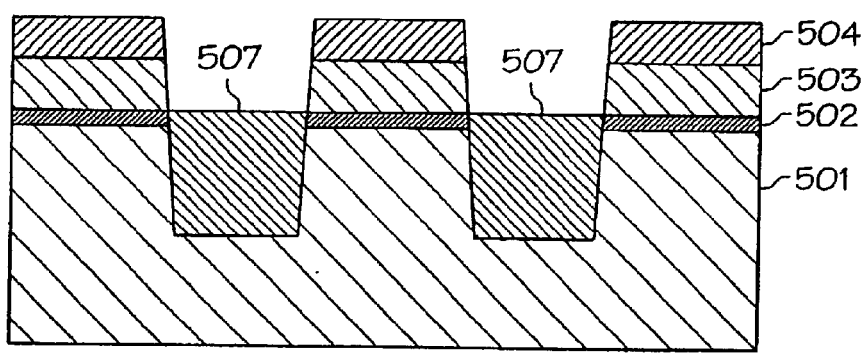
FIG. 5D illustrates a stage of fabrication of the method of FIG. 4.
Figure 5E:
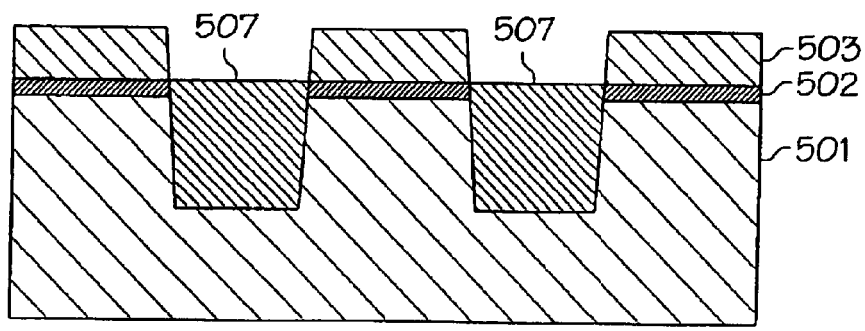
FIG. 5E illustrates a stage of fabrication of the method of FIG. 4.

An oxide etch back is performed at block 408 to remove a determined amount of the field oxide 507 so that the field oxide 507 is below an upper surface of the FG poly layer 503 and above the upper surface of the tunnel oxide layer 503. FIG. 5D illustrates the stacked gate region after the oxide etch back has been performed. The nitride layer 504 is removed at block 409. The nitride layer 504 can be removed by a process such as etching. FIG. 5E illustrates the stacked gate region after the nitride layer 504 has been removed.

Figure 5F:
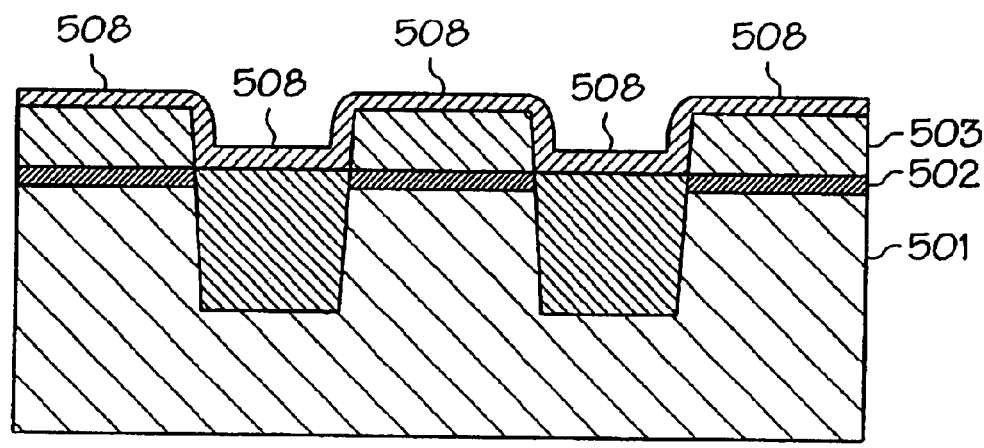
FIG. 5F illustrates a stage of fabrication of the method of FIG. 4.

After the nitride layer 504 has been removed, a second polysilicon layer 508 is deposited over the stacked gate region at block 410. The second polysilicon layer 508 may also be referred to as FG poly 2. FIG. 5F illustrates the stacked gate region at this stage of the method.

Figure 5G:
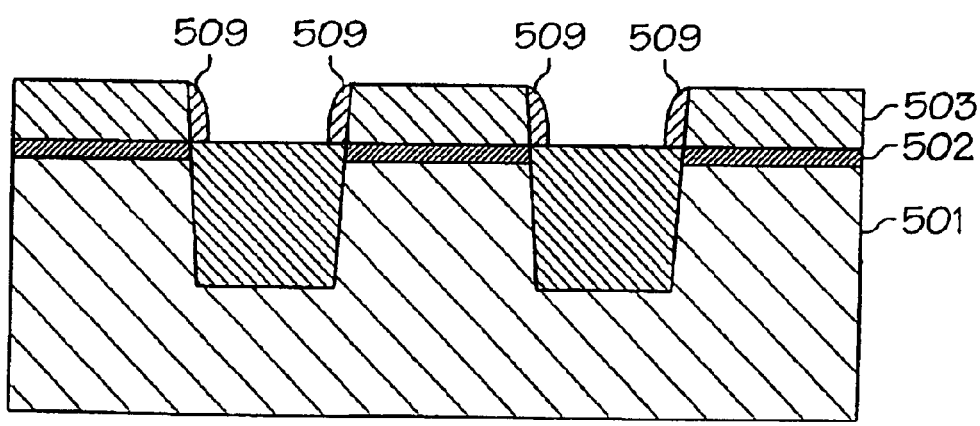
FIG. 5G illustrates a stage of fabrication of the method of FIG. 4.

A spacer etch is performed to remove portions of the second poly layer 508 at block 411 leaving the floating gate poly wings 509 of FIG. 5G. A spacer etch is a method of selectively etching.

Other conventional steps of processing may be performed on the stacked gate region such as, oxide nitride oxide (ONO) formation, control gate (CG) poly deposition, CG poly photolithography and etch, and the like.

Figure 6:
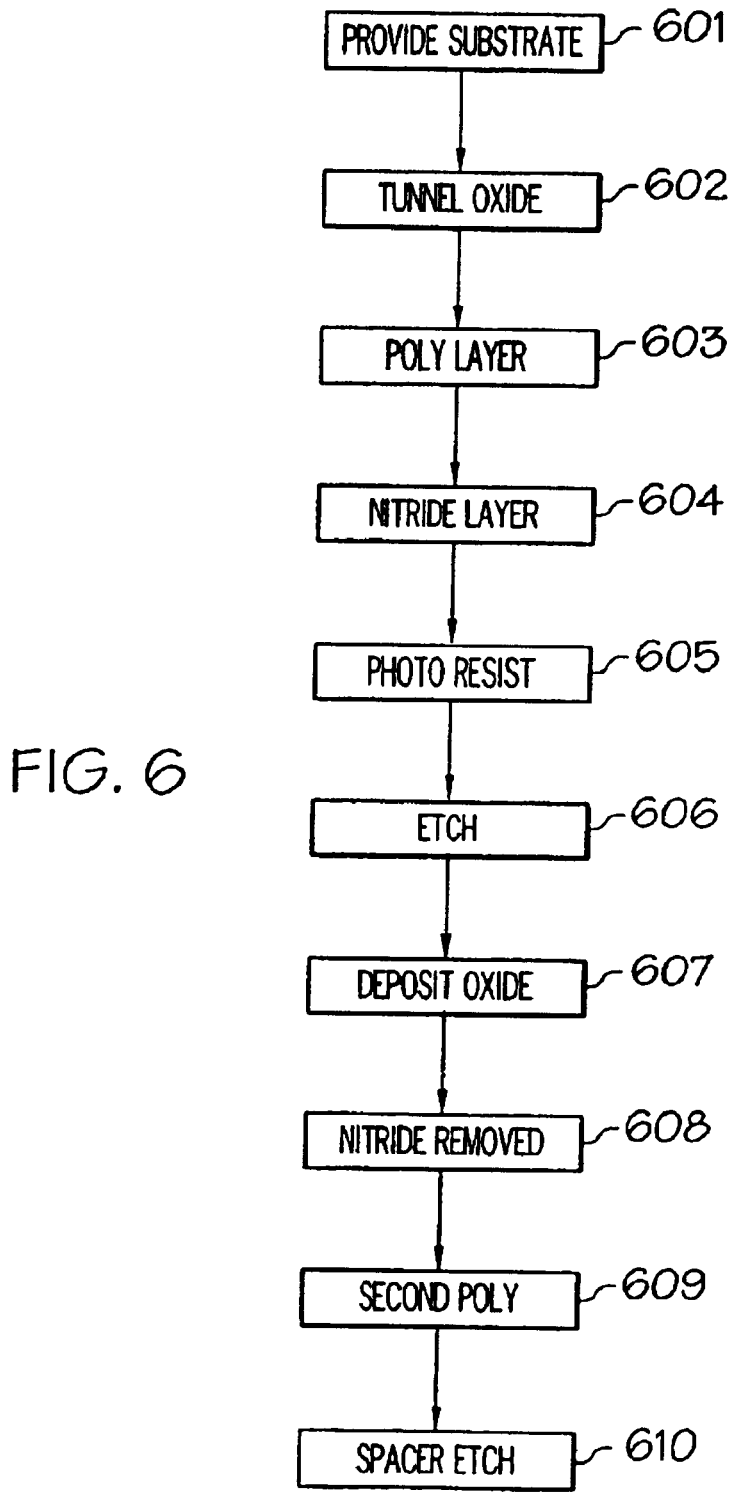
FIG. 6 illustrates a method of fabricating a selected portion of a memory cell according to another embodiment of the invention.

FIG. 6 illustrates a method of fabricating the stacked gate region illustrated in FIG. 2. FIGS. 7A, 7B, 7C, 7D, 7E and 7F illustrate stages of the method of FIG. 6.

Figure 7A:
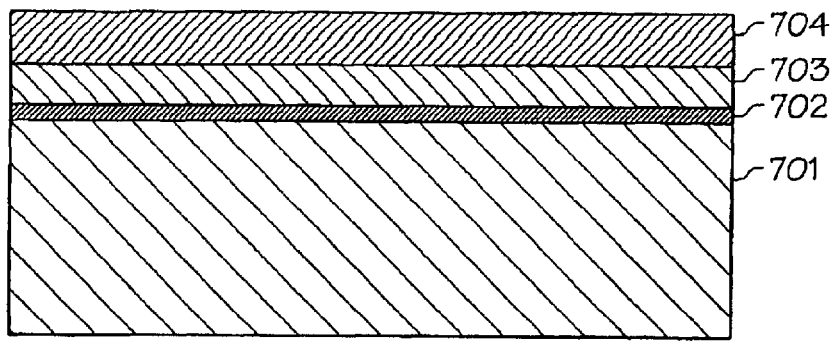
FIG. 7A illustrates a stage of fabrication of the method of FIG. 6.

A substrate 701 is provided at 601. The substrate 701 is, generally, a silicon substrate. A tunnel oxide layer 702 is formed over the substrate 701 at 602. A self aligned floating gate (SA-FG) poly layer 703 is formed over the tunnel oxide layer 702 at 603. A nitride layer 704 is formed over the SA-FG poly layer 703 at block 604. FIG. 7A illustrates the stacked gate region at this stage of the method.

Figure 7B:
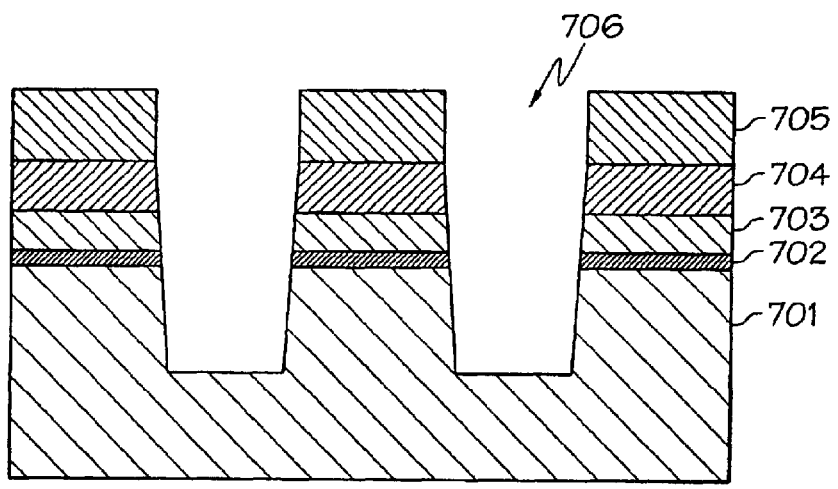
FIG. 7B illustrates a stage of fabrication of the method of FIG. 6.

A layer of photo resist 705 is deposited over the nitride layer 704 in selected areas by utilizing a mask at block 605. The areas covered by the photo resist indicate areas not to be etched and permit forming gates of the stacked gate region. The stacked gate region is etched at block 606. Layers and substrate are removed by the etch to form a shallow trench as shown by 706 in FIG. 7B. The etch performed at block 606, is also referred to as a shallow trench isolation (STI) etch. FIG. 7B illustrates the stacked gate region at this stage of the method.

Figure 7C:
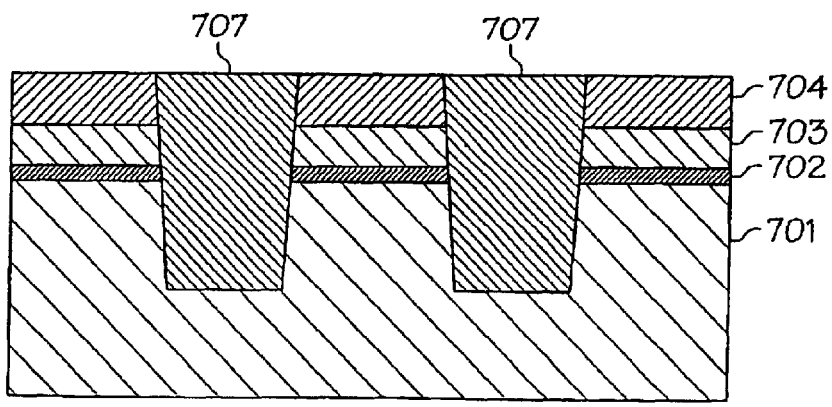
FIG. 7C illustrates a stage of fabrication of the method of FIG. 6.

The photo resist 705 is removed, field oxide 707 is deposited into the trenches and a mechanical planarization is performed at block 607. An example of mechanical planarization which may be used is CMP. FIG. 7C illustrates the stacked gate region at this stage of the method. An oxide etch back is not performed.

Figure 7D:
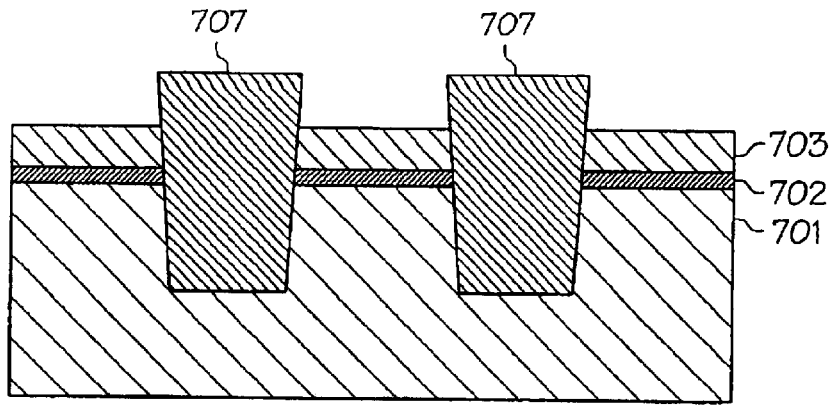
FIG. 7D illustrates a stage of fabrication of the method of FIG. 6.

The nitride layer 704 is removed at block 608. The nitride layer 704 can be removed by a process such as etching. FIG. 7D illustrates the stacked gate region after the nitride layer 704 has been removed.

Figure 7E:
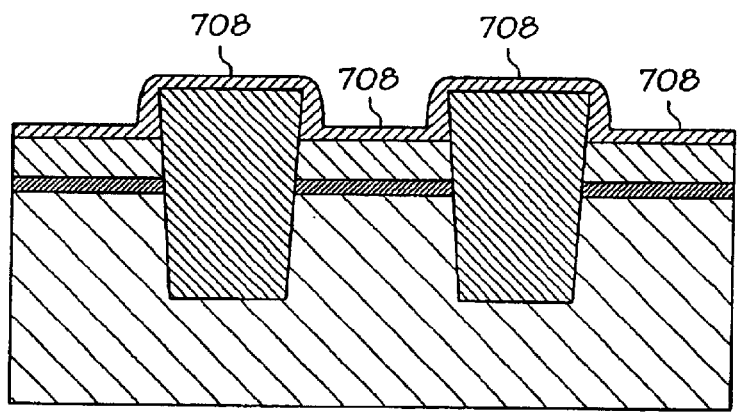
FIG. 7E illustrates a stage of fabrication of the method of FIG. 6.

After the nitride layer 704 has been removed, a second polysilicon layer 708 is deposited over the stacked gate region at block 609. The second polysilicon layer 708 may also be referred to as FG poly 2. FIG. 7E illustrates the stacked gate region at this stage of the method.

Figure 7F:
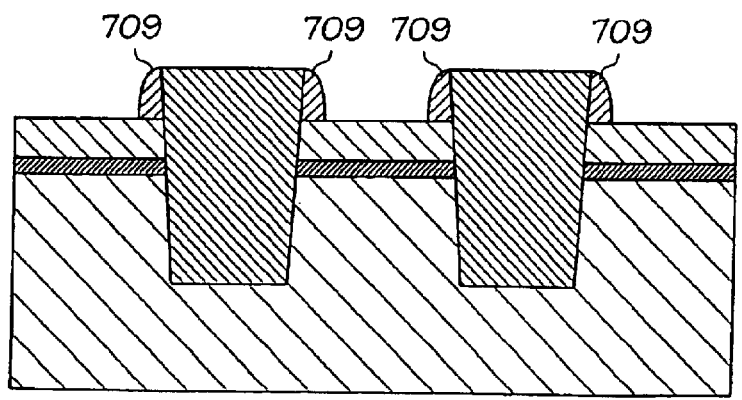
FIG. 7F illustrates a stage of fabrication of the method of FIG. 6.

A spacer etch is performed to remove portions of the second poly layer 708 at block 611 leaving FG poly single sided ears 709 of FIG. 7F to increase capacitive coupling of memory cells of the stacked gate region. FIG. 7F illustrates a stacked gate region after the method has been performed.

Other standard steps of processing may be performed on the stacked gate region such as, oxide nitride oxide (ONO) formation, CG Poly deposition, CG poly photolithography and etch, and the like.

Figure 8:
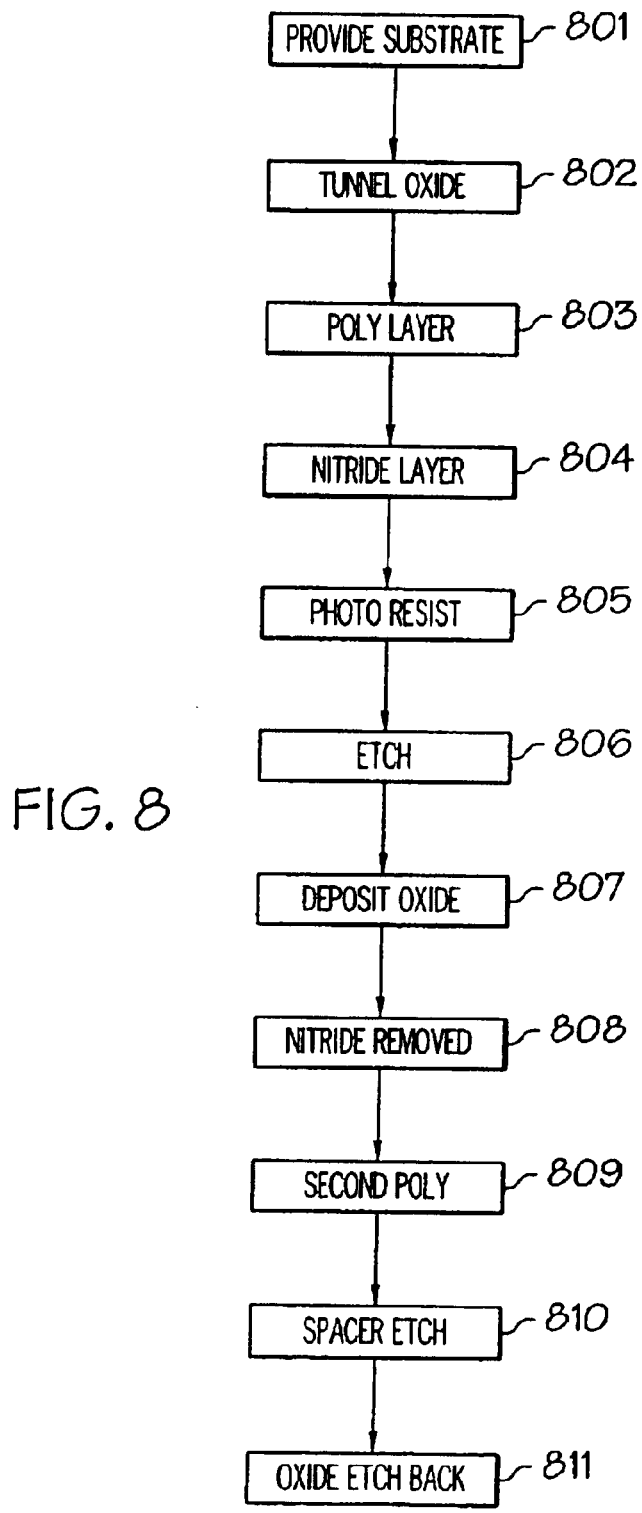
FIG. 8 illustrates a method of fabricating selected portion of a memory cell according to another embodiment of the invention.

FIG. 8 illustrates a method of fabricating the stacked gate region illustrated in FIG. 3. FIGS. 9A, 9B, 9C, 9D, 9E, 9F and 9G illustrate stages of the method of FIG. 8.

Figure 9A:
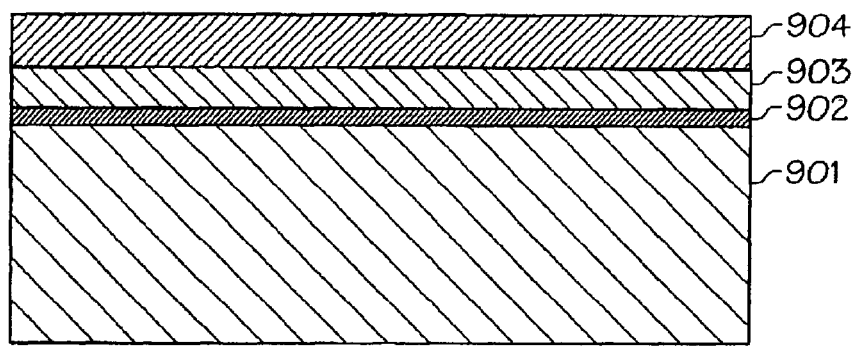
FIG. 9A illustrates a stage of fabrication of the method of FIG. 8.

A substrate 901 is provided at 801. The substrate 901 is, generally, a silicon substrate. A tunnel oxide layer 902 is formed over the substrate 901 at 802. A self aligned floating gate (SA-FG) poly layer 903 is formed over the tunnel oxide layer 902 at 803. A nitride layer 904 is formed over the SA-FG poly layer 903 at block 804. FIG. 9A illustrates the stacked gate region at this stage of the method.

Figure 9B:
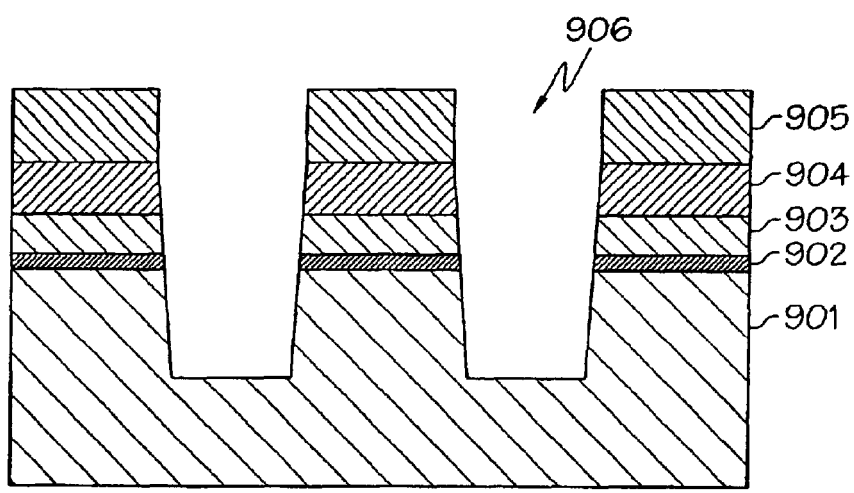
FIG. 9B illustrates a stage of fabrication of the method of FIG. 8.

A layer of photo resist 905 is deposited over the nitride layer 904 in selected areas by utilizing a mask at block 805. The areas covered by the photo resist indicate areas not to be etched and form gates of the stacked gate region. The stacked gate region is etched at block 806. Layers and substrate are removed by the etch to form a shallow trench as shown by 906 in FIG. 9B. The etch performed at block 806, is also referred to as a shallow trench isolation (STI) etch. FIG. 9B illustrates the stacked gate region at this stage of the method.

Figure 9C:
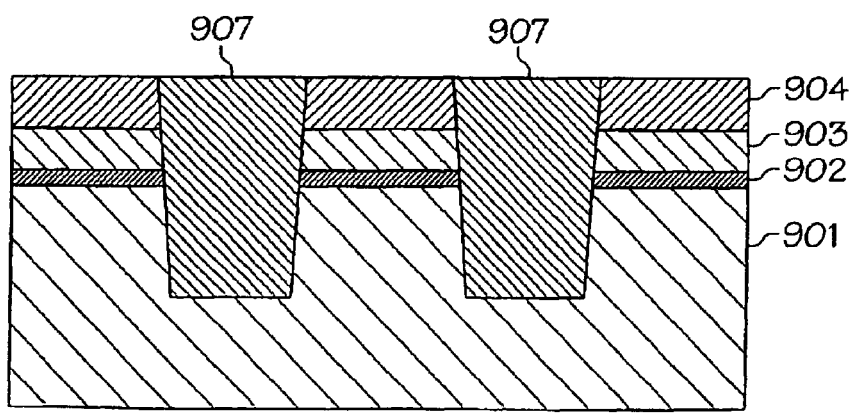
FIG. 9C illustrates a stage of fabrication of the method of FIG. 8.

The photo resist 905 is removed, field oxide 907 is deposited into the trenches and mechanical planarization is performed at block 807. CMP is an example of a type of mechanical planarization that may be used. FIG. 9C illustrates the stacked gate region at this stage of the method.

Figure 9D:
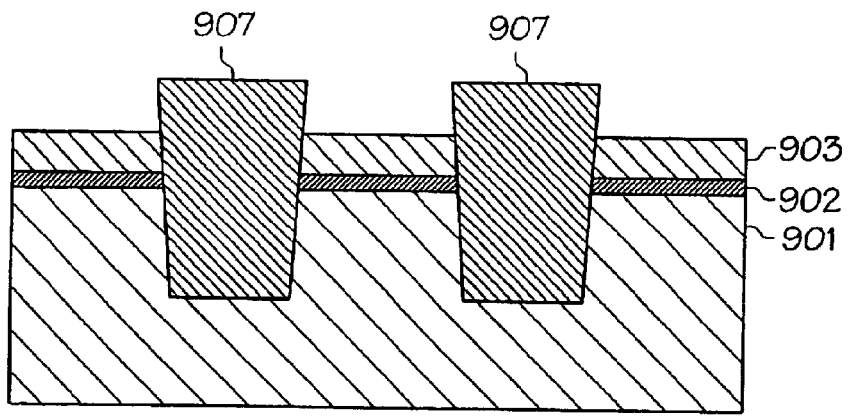
FIG. 9D illustrates a stage of fabrication of the method of FIG. 8.

The nitride layer 904 is removed at block 808. The nitride layer .904 can be removed by a process such as etching. FIG. 9D illustrates the stacked gate region after the nitride layer 904 has been removed.

Figure 9E:
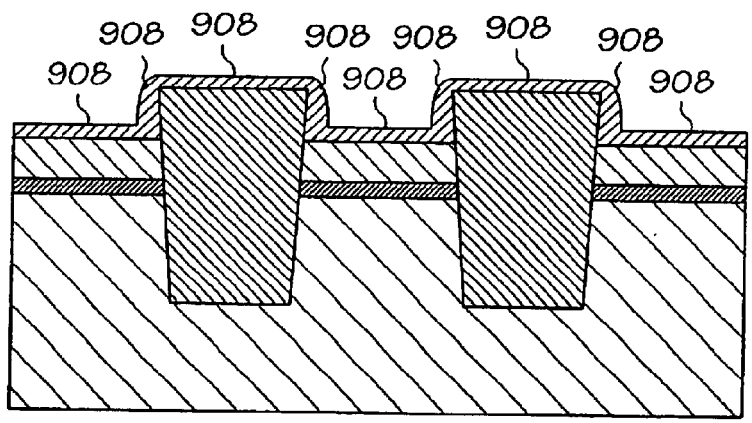
FIG. 9E illustrates a stage of fabrication of the method of FIG. 8.

After the nitride layer 904 has been removed, a second polysilicon layer 908 is deposited over the stacked gate region at block 809. The second polysilicon layer 908 may also be referred to as FG poly 2. The second polysilicon layer 908 is deposited to a selected thickness or height which corresponds to a desired capacitive coupling. FIG. 9E illustrates the stacked gate region at this stage of the method.

Figure 9F:
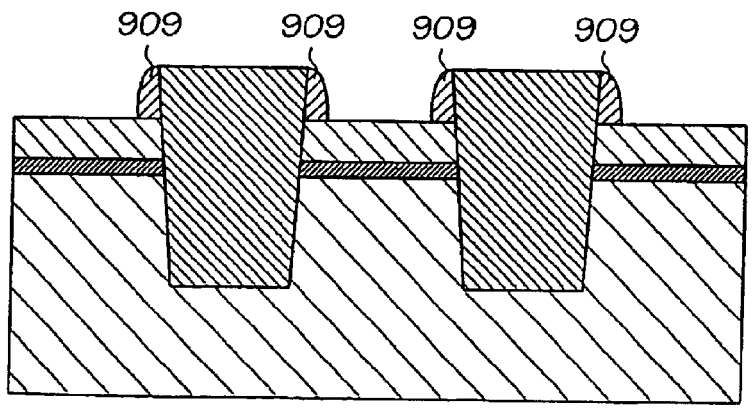
FIG. 9F illustrates a stage of fabrication of the method of FIG. 8.

A spacer etch is performed to remove portions of the second poly layer 908 at block 810 leaving FG poly single sided ears 909 in FIG. 9F.

Figure 9G:
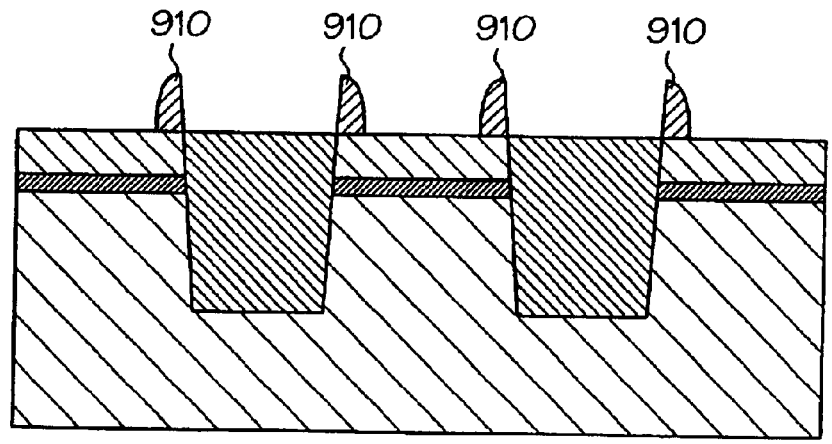
FIG. 9G illustrates a stage of fabrication of the method of FIG. 8.

A field oxide etch back is performed at block 811 to remove a selected amount of field oxide such that the field oxide is below the SA-FG poly 903 but above the tunnel oxide 902. The selected amount of field oxide is removed to create FG poly double sided ears 910 as shown in FIG. 9G by removing the field oxide 707.

Other standard steps of processing may be performed on the stacked gate region such as, oxide nitride oxide (ONO) formation, CG Poly deposition, CG poly photolithography and etch, and the like.

Figure 10:
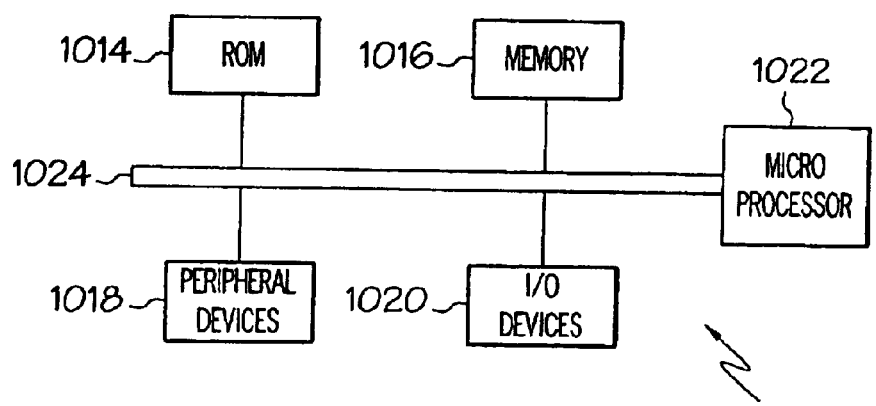
FIG. 10 is a computer system with which embodiments of the invention may be used.

FIG. 10 is an illustration of a computer system 1012 that can use and be used with embodiments of the present invention. As will be appreciated by those skilled in the art, the computer system 1012 would include ROM 1014, mass memory 1016, peripheral devices 1018, and I/O devices 1020 in communication with a microprocessor 1022 via a data bus 1024 or another suitable data communication path. The memory devices 1014 and 1016 can include stacked gate regions fabricated according to the various embodiments of the present invention. ROM 1014 can include EPROM or EEPROM or flash memory. Mass memory 1016 can include DRAM, synchronous RAM or flash memory.

For the purposes of describing and defining the present invention, formation of a material "on" a substrate or layer refers to formation in contact with a surface of the substrate or layer. Formation "over" a substrate or layer refers to formation above or in contact with a surface of the substrate. A "flash memory device" includes a plurality of memory cells. Each "memory cell" of a flash memory device can comprise components such as a gate, floating gate, control gate, wordline, channel region, a source, self aligned source and a drain. The term "patterning" refers to one or more steps that result in the removal of selected portions of layers. The patterning process is also known by the names photomasking, masking, photolithography and microlithography. The term "self-aligned gate" refers to a memory device where the gate electrodes are formed before the source/drain diffusions are made.

Many other electronic devices can be fabricated utilizing various embodiments of the present invention. For example, memory devices according to embodiments of the invention can be used in electronic devices such as cell phones, digital cameras, digital video cameras, digital audio players, cable television set top boxes, digital satellite receivers, personal digital assistants and the like.

Having described the invention in detail and by reference to preferred embodiments thereof, it will be apparent that modifications and variations are possible without departing from the scope of the invention defined in the appended claims. Other suitable materials may be substituted for those specifically recited herein. For example, the substrate may be composed of semiconductors such as gallium arsenide or germanium. Additionally, other dopants may be utilized besides those specifically stated. Generally, dopants are found in groups III and V of the periodic table. Other placements of the polysilicon wings or ears with respect to a floating gate may be used and still be encompassed by the present invention.

What is claimed is:

1. A stacked gate region of a memory cell comprising:
    a tunnel oxide; and
    a floating gate provided on said tunnel oxide with a wing having a portion directly above said tunnel oxide, said wing having a height larger than a width, and wherein said wing is not provided on said tunnel oxide.

2. The stacked gate region of claim 1, wherein said floating gate comprises polysilicon.

3. The stacked gate region of claim 1, wherein said wing comprises polysilicon.

4. The stacked gate region of claim 1, wherein said wing and said floating gate comprises polysilicon.

5. The stacked gate region of claim 1, wherein said wing is substantially co-planar with said floating gate.

6. The stacked gate region of claim 1, wherein said wing is adjacent a sloped side of said floating gate.

7. The stacked gate region of claim 1, wherein said at least one wing is comprised of a first polysilicon layer and said floating gate is comprised of a second polysilicon layer, wherein said second polysilicon layer is different than said first polysilicon layer.

8. The stacked gate region of claim 1, wherein said floating gate comprises a plurality of floating gates each with a corresponding pair of wings.

9. The stacked gate region of claim 1, wherein said height corresponds to a desired capacitive coupling.

10. The stacked gate region of claim 1, further comprises a field oxide, wherein said field oxide is co-planar with a surface of said tunnel oxide.

11. The stacked gate region of claim 1, further comprises a field oxide, wherein said wing is located adjacent a sloped side of said floating gate, is co-planer with said floating gate layer, and is over a portion of said field oxide.

12. The stacked gate region of claim 1, wherein said memory cell comprising:
    a substrate, wherein said tunnel oxide is formed over said substrate;
    a source formed in said substrate;
    a drain formed in said substrate;
    at least one trench formed in said substrate;
    a field oxide region formed in said trench;
    a dielectric layer formed over said substrate and said floating gate; and
    a control gate layer formed over said dielectric layer.

13. The stacked gate region of claim 1, wherein said memory cell is one of a plurality of similar memory cells aligned in a plurality of rows and columns, each memory cell further including:
    a source formed in a common region with a source of an adjacent memory cell;
    a drain formed in another common region with a drain of an adjacent memory cell;
    a field oxide region to electrically isolating adjacent said memory cells;
    a dielectric layer formed over said floating gate;
    a control gate layer formed over said dielectric layer, said control gate is associated with a row of said plurality of memory cells, formed integral to a common word line associated with said row;
    a conductive bit line connected to said drain of each memory cell in a column of said plurality of memory cells; and
    a common source line connected to said source of each memory cell.

14. The stacked gate region of claim 1, wherein said memory cell is included in a memory device.

15. The stacked gate region of claim 1, wherein said memory cell is included in a computer system having a processor, a system bus, and a memory device coupled to said system bus, said memory device including one or more of said memory cells.

16. A stacked gate region of a memory cell comprising:
    a tunnel oxide layer;
    a floating gate layer with a sloped side provided on said tunnel oxide layer; and
    a wing with a portion directly above said tunnel oxide layer and provided adjacent said sloped side, wherein said wing is not provided on said tunnel oxide layer.

17. The stacked gate region of claim 16, wherein said wing is substantially co-planar with said floating gate layer.

18. The stacked gate region of claim 16, further comprising a field oxide layer, wherein said field oxide layer is co-planar with a surface of said tunnel oxide layer.

19. The stacked gate region of clam 16, wherein said wing has a height larger than a width.

20. A stacked gate region of a memory cell comprising:
   a tunnel oxide layer;
   a floating gate layer with a sloped side provided on said tunnel oxide layer; and
   a wing having a height larger than a width and with a portion directly above said tunnel oxide layer, said wing being provided adjacent said sloped side.

21. The stacked gate region of claim 20, wherein said floating gate layer comprises polysilicon.

22. The stacked gate region of claim 20, wherein said wing comprises polysilicon.

23. The stacked gate region of claim 20, wherein said wing and said floating gate layer comprise polysilicon.

24. The stacked gate region of claim 20, wherein said wing is substantially co-planar with said floating gate layer.

25. The stacked gate region of claim 20, wherein said wing is comprised of a first polysilicon layer and said floating gate layer is comprised of a second polysilicon layer, wherein said second polysilicon layer is different than said first polysilicon layer.

26. The stacked gate region of claim 20, wherein said height corresponds to a desired capacitive coupling.

27. The stacked gate region of claim 20, further comprises a field oxide, wherein said field oxide is co-planar with a surface of said tunnel oxide layer.

28. The stacked gate region of claim 20, further comprises a field oxide, wherein said wing is both co-planar with said floating gate layer and over a portion of said field oxide.

29. The stacked gate region of claim 20, wherein said memory cell comprises:
   a substrate, wherein said tunnel oxide layer is formed over said substrate;
   a source formed in said substrate;
   a drain formed in said substrate;
   at least one trench formed in said substrate;
   a field oxide region formed in said trench;
   a dielectric layer formed over said substrate and said floating gate layer; and
   a control gate layer formed over said dielectric layer.

30. The stacked gate region of claim 20, wherein said memory cell is one of a plurality of similar memory cells aligned in a plurality of rows and columns.

31. The stacked gate region of claim 20, wherein said memory cell further including:
   a source formed in a common region with a source of an adjacent memory cell;
   a drain formed in another common region with a drain of another adjacent memory cell;
   a field oxide region;
   a dielectric layer formed over said floating gate;
   a control gate layer formed over said dielectric layer;
   a conductive bit line connected to said drain; and
   a common source line connected to said source.

32. The stacked gate region of claim 20, wherein said memory cell is included in a memory device.

33. The stacked gate region of claim 20, wherein said memory cell is included in a computer system having a processor, a system bus, and a memory device coupled to said system bus, said memory device including one or more of said memory cells.

* * * * *